(12) United States Patent
Lee

(10) Patent No.: US 12,287,363 B2
(45) Date of Patent: Apr. 29, 2025

(54) CONTACT DEVICE AND CHARACTERISTIC MEASURING DEVICE INCLUDING THE SAME

(71) Applicant: LG Energy Solution, Ltd., Seoul (KR)

(72) Inventor: Ho Jung Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/278,486

(22) PCT Filed: Oct. 12, 2022

(86) PCT No.: PCT/KR2022/015390
§ 371 (c)(1),
(2) Date: Aug. 23, 2023

(87) PCT Pub. No.: WO2023/113179
PCT Pub. Date: Jun. 22, 2023

(65) Prior Publication Data
US 2024/0133938 A1   Apr. 25, 2024
US 2024/0230744 A9   Jul. 11, 2024

(30) Foreign Application Priority Data

Dec. 14, 2021 (KR) .................. 10-2021-0179150
Oct. 5, 2022 (KR) .................. 10-2022-0127422

(51) Int. Cl.
*H01H 31/12* (2006.01)
*G01R 31/12* (2020.01)

(52) U.S. Cl.
CPC ................ *G01R 31/1263* (2013.01)

(58) Field of Classification Search
CPC ............ G01R 31/1263; G01R 31/1227; G01R 31/3865; G01R 31/378; G01R 31/385;
(Continued)

(56) References Cited

U.S. PATENT DOCUMENTS 10,481,215 B2   11/2019   Cai et al.
2011/0191043 A1   8/2011   Lee et al.
(Continued)

FOREIGN PATENT DOCUMENTS

CN   102788904 A   11/2012
CN   203908885 U   10/2014
(Continued)

OTHER PUBLICATIONS

International Search Report for PCT/KR2022/015390 mailed Jan. 26, 2023. 3 pages.
(Continued)

*Primary Examiner* — Thang X Le
(74) *Attorney, Agent, or Firm* — Lerner David LLP

(57) ABSTRACT

A contact device and a characteristic measuring device including the same includes: a body part in which a connection hole having a shape passing through the body part from one surface toward the other surface is defined; a connection part including a first shaft provided at one side and connected to the connection hole, and a second shaft provided to be parallel to the first shaft at the other side; and a contact part having a coupling hole, the coupling hole having a shape passing through the contact part so that the second shaft is coupled therethrough, and the other side provided with a terminal in contact with the cell. The connection part is rotatable with respect to the body part by the first shaft, and the contact part is rotatable with respect to the connection part by the second shaft.

10 Claims, 8 Drawing Sheets

(58) Field of Classification Search
CPC ............... G01R 31/396; G01R 27/025; H01M 10/4285; H01M 50/105; Y02E 60/10
See application file for complete search history.

(56) References Cited

U.S. PATENT DOCUMENTS

| | | | |
|---|---|---|---|
| 2012/0019256 A1 | 1/2012 | Lee et al. | |
| 2012/0071040 A1* | 3/2012 | Park | H01R 4/489 439/889 |
| 2016/0079635 A1* | 3/2016 | Niwa | H01M 50/553 324/426 |
| 2020/0264211 A1* | 8/2020 | Nah | G01R 1/06722 |
| 2022/0065948 A1* | 3/2022 | Kim | H01M 10/4285 |
| 2023/0160967 A1 | 5/2023 | Huh et al. | |

FOREIGN PATENT DOCUMENTS

| | | |
|---|---|---|
| CN | 211785692 U | 10/2020 |
| CN | 213715275 U | 7/2021 |
| JP | S48029501 Y1 | 4/1973 |
| JP | S59012060 U | 1/1984 |
| JP | S59095268 U | 6/1984 |
| JP | H0230066 U | 2/1990 |
| JP | H05087571 B2 | 12/1993 |
| JP | 2010127706 A | 6/2010 |
| JP | 2012505513 A | 3/2012 |
| JP | 2012514183 A | 6/2012 |
| JP | 2015108605 A | 6/2015 |
| JP | 2018179619 A | 11/2018 |
| JP | 2019527824 A | 10/2019 |
| JP | 2020134529 A | 8/2020 |
| JP | 2021105557 A | 7/2021 |
| KR | 20040072069 A | 8/2004 |
| KR | 100625220 B1 | 9/2006 |
| KR | 101058388 B1 | 8/2011 |
| KR | 20130009232 A | 1/2013 |
| KR | 20130053641 A | 5/2013 |
| KR | 101273611 B1 | 6/2013 |
| KR | 20150037088 A | 4/2015 |
| KR | 101738721 B1 | 5/2017 |
| KR | 20170107246 A | 9/2017 |
| KR | 20190100737 A | 8/2019 |
| KR | 102196851 B1 | 12/2020 |
| WO | 2021194162 A1 | 9/2021 |

OTHER PUBLICATIONS

Extended European Search Report including Written Opinion for Application No. 22907650.0 dated Sep. 5, 2024, pp. 1-5.

* cited by examiner

CONTACT DEVICE AND CHARACTERISTIC MEASURING DEVICE INCLUDING THE SAME

CROSS-REFERENCE TO RELATED APPLICATIONS

The present application is a national phase entry under 35 U.S.C. § 371 of International Application No. PCT/KR2022/015390 filed on Oct. 12, 2022 which claims the benefit of priority based on Korean Patent Application Nos. 10-2021-0179150, filed on Dec. 14, 2021, and 10-2022-0127422, filed on Oct. 5, 2022, all contents of which are incorporated herein by reference.

TECHNICAL FIELD

The present disclosure relates to a contact device and a characteristic measuring device including the same, and more particularly, to a contact device, which is used to measure cell characteristics necessary for manufacturing of a secondary battery, and a characteristic measuring device including the contact device.

BACKGROUND ART

Recently, as prices of energy sources rise due to depletion of fossil fuels and interests about environmental pollution are amplified, a need for eco-friendly alternative energy sources is indispensable for life in the future. Accordingly, research continues on various power generation technologies using sunlight, wind power, tidal power, and so on, and there is also a continuing great interest in power storage systems, such as batteries, for more efficiently using electrical energy generated through the technologies.

Moreover, as the technical development of and a demand for mobile electronic devices and electric vehicles using batteries increase, a demand for batteries as energy sources rapidly increases. Accordingly, much research is conducted on batteries that can meet the various needs.

Batteries that store electrical energy may be generally classified into primary batteries and secondary batteries. While the primary batteries are disposable consumable batteries, the secondary batteries are rechargeable batteries manufactured using a material in which a redox process is repeatable. That is, when a reduction reaction is performed on the material by the current, power is charged, and when an oxidation reaction is performed on the material, power is discharged. Such a charging-discharging is repeatedly performed to generate electricity.

In particular, in terms of materials, lithium secondary batteries such as lithium-ion batteries and lithium-ion polymer batteries, which have advantages such as high energy density, discharge voltage, and output stability, are in high demand.

Secondary batteries are rechargeable unlike primary batteries, and classified into a coin type cell, a cylinder type cell, a prismatic type cell, and a pouch type cell according to the shape of cases.

In a manufacturing process for secondary batteries, assembling of a cell is completed and then, a voltage is measured between a metal layer, which is exposed to an outer circumferential end of a battery case such as a pouch of the pouch type cell, and an electrode terminal of the cell, to check a defect of insulation resistance between the metal layer and the electrode terminal. The insulation resistance and the like of the cell are measured using a characteristic measuring device, and a contact device of the characteristic measuring device is in contact with an outer circumference of the battery case to measure the insulation resistance or the like.

As the outer circumference of the battery case may have a rectangular shape and also have a chamfered shape, the contact device requires a motion such as rotation. Thus, a contact device according to the related art has a rotatable portion and is fixed in a rotated state.

Such a shape has problems that when the cell is set to be biased, the contact device is not in contact with the cell or is in contact with only a portion of the cell to cause a contact failure, and accordingly, efficiency of the overall process is deteriorated.

In order to solve the problems above, a way to minimize the contact failure of the contact device and thus increase the efficiency of the process is needed.

DISCLOSURE OF THE INVENTION

Technical Problem

An aspect of the present invention has been devised to solve the problems as described above and an object of the present invention is to a contact device and a characteristic measuring device including the same, which may minimize a contact failure of the contact device and increase accuracy and efficiency of a process by adding a motion such as rotation. The contact device of the characteristic measuring device, measures insulation resistance or the like of a cell, so that all surfaces of the contact device are in contact with the cell.

Technical Solution

A contact device of a characteristic measuring device, which measures characteristics of a cell, according to the present technology includes: a body part in which a connection hole having a shape passing through the body part from one surface toward the other surface is defined; a connection part including a first shaft provided at one side and connected to the connection hole, and a second shaft provided to be parallel to the first shaft at the other side; and a contact part having one side at which a coupling hole is defined, wherein the coupling hole has a shape passing through the contact part from one surface toward the other surface so that the second shaft is coupled therethrough, and the other side provided —with a terminal in contact with the cell, wherein the connection part is rotatable with respect to the body part by the first shaft, and the contact part is rotatable with respect to the connection part by the second shaft.

The coupling hole may have a cross section of which a length is greater than a width so that the second shaft is movable in a longitudinal direction.

The contact device may further include a pair of elastic members, each of which has one end connected to the connection part and the other end connected to the contact part. The elastic member may provide an elastic force so that the contact part of which a position has changed returns to an initial position.

The elastic members may be disposed parallel to each other.

The connection part may further include a pair of connection pillars extending to be parallel to each other at both sides of the first shaft in a longitudinal direction, and the pair of elastic members may be fitted into the pair of connection pillars, respectively.

The body part may have an outer surface on which an angle range is displayed, and the connection part may further include an indicator disposed at one end of the second shaft so as to indicate the angle while rotating with respect to the body part.

The contact device may further include a controller connected to the connection part and the contact device, and the controller may rotate the connection part and the contact device depending on a preset value of the cell.

A characteristic measuring device that measures characteristics of a pouch cell includes a base on which the pouch cell is disposed, a pressing device that is disposed above the base and presses and fixes the pouch cell disposed on the base, and a contact device that is in contact with the pouch cell so as to approach the pouch cell and measure the characteristics thereof. The contact device includes: a body part in which a connection hole having a shape passing through the body part from one surface toward the other surface is defined; a connection part including a first shaft connected to the connection hole at one side and a second shaft provided to be parallel to the first shaft at the other side; and a contact part having one side in which a coupling hole is defined, the coupling hole having a shape passing through the contact part from one surface toward the other surface so that the second shaft is coupled therethrough, and the other side provided with a terminal in contact with the cell, wherein the connection part is rotatable with respect to the body part by the first shaft, and the contact part is rotatable with respect to the connection part by the second shaft.

The coupling hole may have a cross section of which a length is greater than a width so that the second shaft is movable in a longitudinal direction.

The contact device may further include a pair of elastic members, each of which has one end connected to the connection part and the other end connected to the contact part. The elastic member may provide an elastic force so that the contact part of which a position has changed returns to an initial position.

Advantageous Effects

The contact device of the characteristic measuring device according to the present technology, which measures the characteristics of the cell, includes the body part, in which the connection hole having the shape passing through the body part from the one surface to the other surface is defined, the connection part, which includes a first shaft provided at the one side and connected to the connection hole, and the second shaft provided to be parallel to the first shaft at the other side, and the contact part, which has the one side at which the coupling hole is defined, the coupling hole having the shape passing through the contact part from the one surface toward the other surface so that the second shaft is coupled therethrough, and the other side provided with the terminal in contact with the cell. The connection part is rotatable with respect to the body part by the first shaft, and the contact part is rotatable with respect to the second shaft.

Accordingly, the contact failure of the contact device may be minimized and the accuracy and efficiency of the process may increase by adding the motion such as the rotation, to the contact device of the characteristic measuring device, which measures the insulation resistance or the like of the cell, so that the all surfaces of the contact device are in contact with the cell.

DETAILED DESCRIPTION

Figure 1:
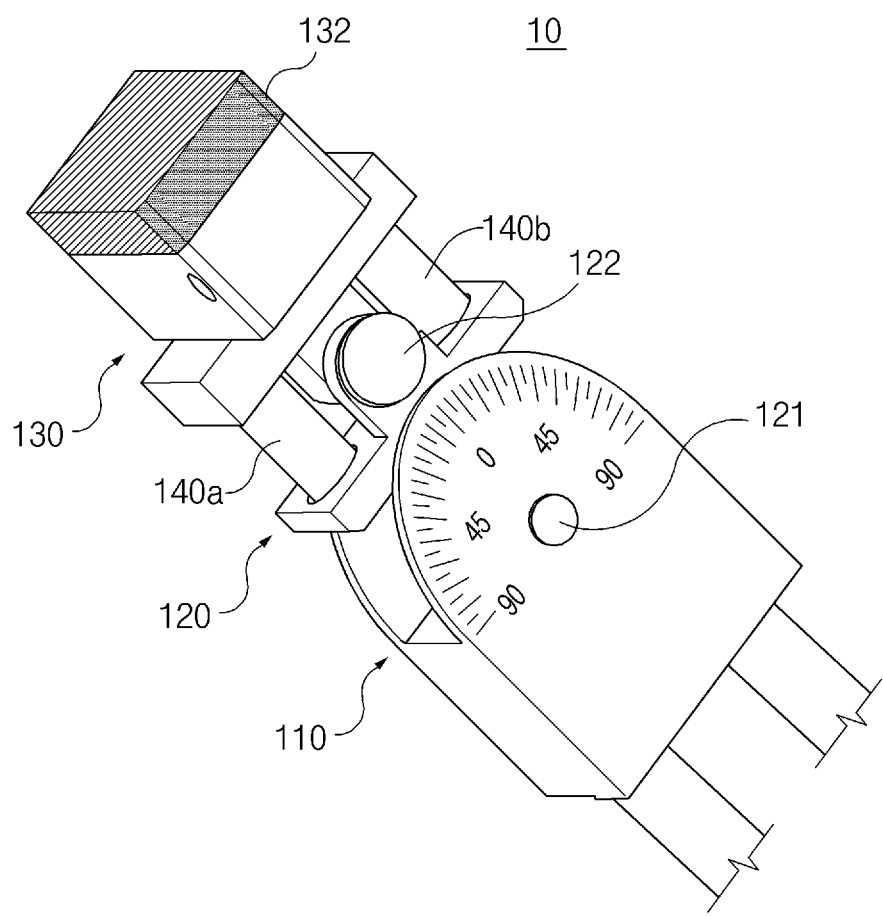
FIG. 1 is a perspective view schematically illustrating a contact device according to Embodiment 1 of the present invention.

Hereinafter, preferred embodiments of the present invention will be described in detail with reference to the accompanying drawings to enable those skilled in the art to easily carry out the present technology. The present invention may, however, be embodied in different forms and should not be construed as limited by the embodiments set forth herein.

The parts unrelated to the description, or the detailed descriptions of related well-known art that may unnecessarily obscure subject matters of the present technology, will be excluded in order to clearly describe the embodiments of the present invention. Like reference numerals refer to like elements throughout the whole specification.

Moreover, terms or words used in this specification and claims should not be restrictively interpreted as ordinary meanings or dictionary-based meanings, but should be interpreted as meanings and concepts conforming to the scope of the present invention on the basis of the principle that an inventor can properly define the concept of a term to describe and explain his or her invention in the best ways.

Embodiment 1

The present disclosure provides a contact device 10 as Embodiment 1.

Figure 2A:
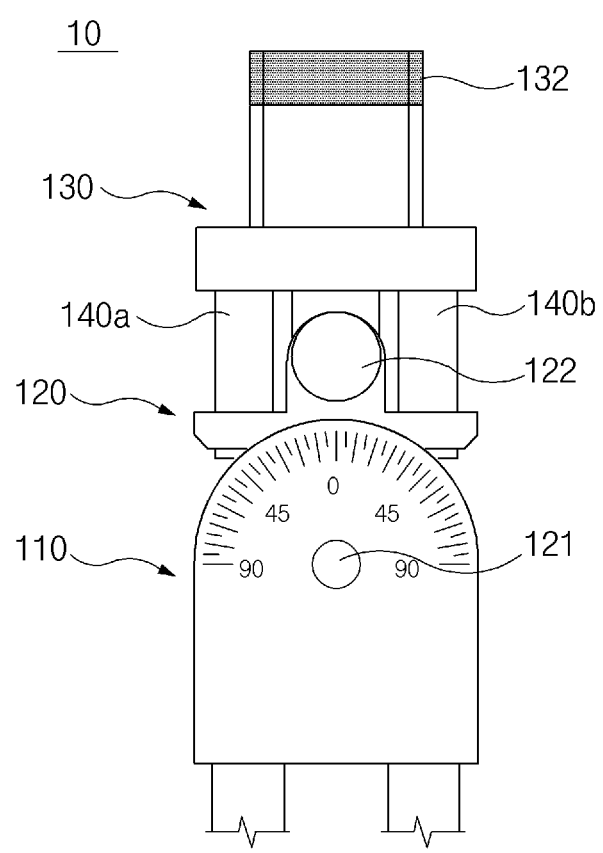
FIG. 2A is a front view schematically illustrating a contact device according to Embodiment 1 of the present invention when viewed from a front side.
Figure 2B:
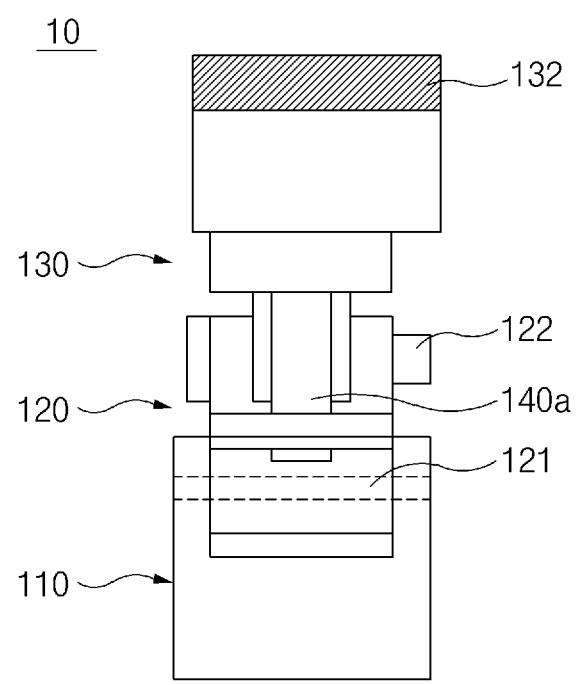
FIG. 2B is a side view schematically illustrating a contact device according to Embodiment 1 of the present invention when viewed from a side.

FIG. 1 is a perspective view schematically illustrating the contact device 10 according to Embodiment 1 of the present invention. FIGS. 2A and 2B are a front view and a side view schematically illustrating the contact device 10 according to Embodiment 1 of the present invention when viewed from a front side and a side, respectively.

The contact device 10 according to Embodiment 1 of the present invention may be used in a characteristic measuring device 1 that measures characteristics of a cell 2, such as insulation resistance. The contact device 10 of the characteristic measuring device 1 may be in contact with an outer circumference of a battery case to measure the characteristics of the cell 2. Representative examples of the cell 2 of which the characteristics are measured include a pouch type cell, and so on.

Referring to FIGS. 1 to 2B, the contact device 10 may include a body part 110, a connection part 120, and a contact part 130 for efficient contact with the cell 2. The body part 110, the connection part 120, and the contact part 130 may be coupled, respectively, and connected to each other through specific components so as to be rotatable independently of each other. The components connected to each other will be described later in detail.

Figure 3:
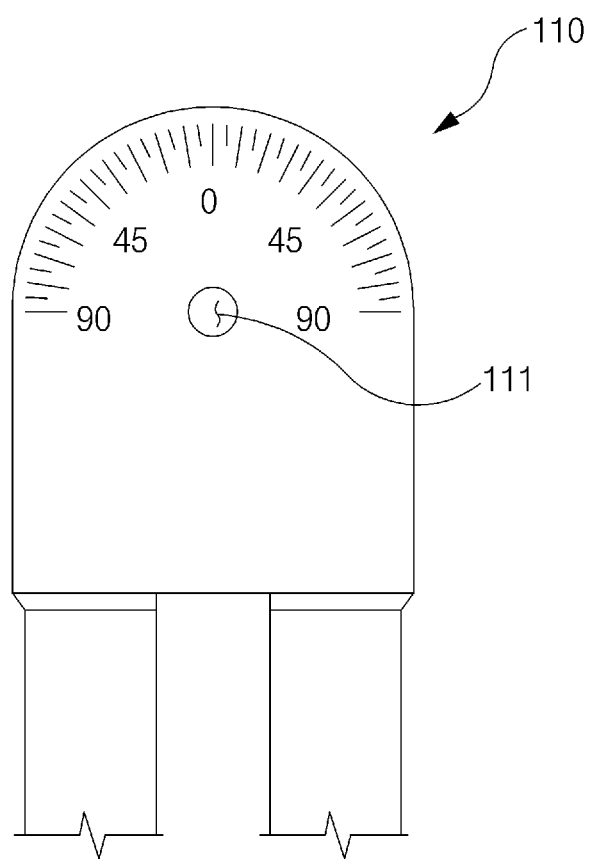
FIG. 3 is a plan view schematically illustrating a body part of a contact device according to Embodiment 1 of the present invention.

FIG. 3 is a plan view schematically illustrating the body part 110 of the contact device 10 according to Embodiment 1 of the present invention.

The body part 110 may be disposed at the lowest side of the contact device 10. Referring to FIG. 3, the body part 110 according to Embodiment 1 may have a cross section of which an upper portion has a semicircular shape and a lower portion has a rectangular shape when viewed from a front side. When the upper portion of the body part 110 has a semicircular shape when viewed from a front side, there may be an effect that an angle displayed on an upper outer surface is easily recognized. The angle displayed on the outer circumference will be described later in detail. Such a shape of the cross section is just one example, and is not necessarily limited thereto.

A connection hole 111 may be defined in the body part 110. The connection hole 111 is a hole defined to cross from one surface to the other surface of the body part 110, and may be a space to which a first shaft 121 of the connection part 120 to be described later is coupled.

The connection hole 111 may be defined in the middle with respect to a left-right direction, and may be defined at a boundary between the upper portion having a semicircular shape and the lower portion having a rectangular shape with respect to an upward-downward direction when the body part 110 is viewed from a front side.

The first shaft 121 of the connection part 120 is coupled to the connection hole 111 to allow for left-right rotation of the connection part 120. Thus, in order for the connection part 120 to easily rotate, the connection hole 111 may be defined so as to have a cross section having, preferably, a circular shape. However, the shape is not necessarily limited thereto.

When both the connection hole 111 and the first shaft 121 have a circular cross section, the connection hole 111 of the body part 110 may have a circular cross section of which a diameter is greater than the diameter of a cross section of the first shaft 121 so as to allow for easy left-right rotation of the connection part 120.

An empty space may be defined inside an upper portion of the body part 110 with respect to the connection hole 111, so that a rotational motion of the connection part 120 is not interrupted by the body part 110 when the connection part 120 rotates in the left-right direction. That is, as the connection part 120 passes through the empty space defined inside the body part 110 while rotating in the left-right direction, the connection part 120 may not be impeded by the body part 110. The empty space defined inside the body part 110 is sufficient as long as the connection part 120 is rotatable in the empty space.

An additional component such as a member for receiving an electric power supply, may be coupled to the lower portion of the body part 110.

Figure 4:
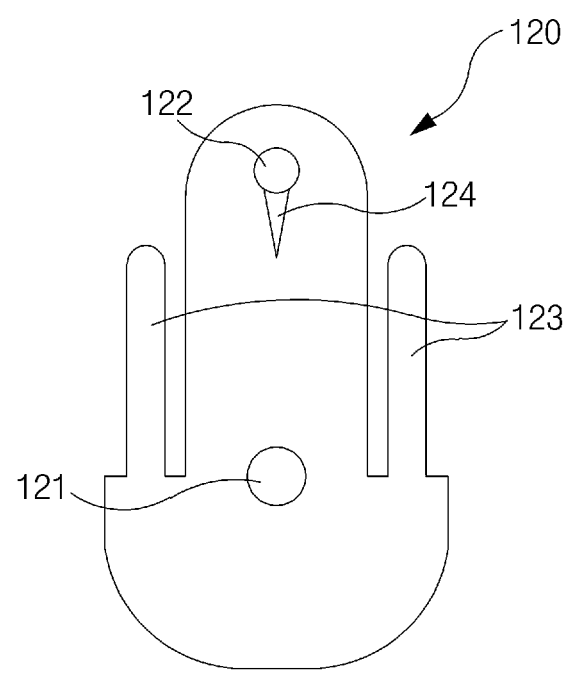
FIG. 4 is a plan view schematically illustrating a connection part of a contact device according to Embodiment 1 of the present invention.

FIG. 4 is a plan view schematically illustrating the connection part 120 of the contact device 10 according to Embodiment 1 of the present invention.

The connection part 120 may be disposed above the body part 110. Referring to FIG. 4, the connection part 120 of the contact device 10 may include the first shaft 121 and a second shaft 122 so as to allow for the left-right rotation of the connection part 120 and the contact part 130. The first shaft 121 and the second shaft 122 may be provided to be parallel to each other at a lower side and an upper side of the connection part 120, respectively, and may each have be elongated so as to extend along a left-right direction when viewed from the side view illustrated in FIG. 2B.

The first shaft 121 and the second shaft 122 of the connection part 120 may each have, preferably, a cylindrical shape so as to allow for easy left-right rotation of the connection part 120 and the contact part 130, but the shape is not necessarily limited thereto.

As described above, the first shaft 121 may be coupled to the connection hole 111 of the body part 110 to allow for the left-right rotation of the connection part 120. As one example of a method of coupling the first shaft 121 and the connection hole 111 to each other, the first shaft 121 of the connection part 120 may be fitted into the connection hole 111 of the body part 110 and then, a member such as a cap, may be coupled to each of both ends of the first shaft 121 so that the first shaft 121 is not movable in a longitudinal direction.

The second shaft 122 may be coupled to a coupling hole 131 of the contact part 130 to allow for the left-right rotation of the contact part 130. As one example of a method of coupling the second shaft 122 and the coupling hole 131 to each other, like the method of coupling the first shaft 121 and the connection hole 111 to each other described above, the second shaft 122 of the connection part 120 may be fitted into the coupling hole 131 of the contact part 130 and then, a member such as a cap, may be coupled to each of both ends of the second shaft 122 so that the second shaft 122 is not be movable in a longitudinal direction.

In an embodiment of the present invention, both the connection part 120 and the contact part 130 are rotatable. In this regard, when the contact device 10 approaches and is in contact with the cell 2, it is advantageous in measuring the characteristics of the cell 2 that the rotation of the connection part 120 and the rotation of the contact part 130 may be performed independently of each other and smoothly follow each other. Therefore, the first shaft 121 and the second shaft 122 of the connection part 120 may be disposed on the same line in front of the connection part 120 in the upward-downward direction.

Figure 5:
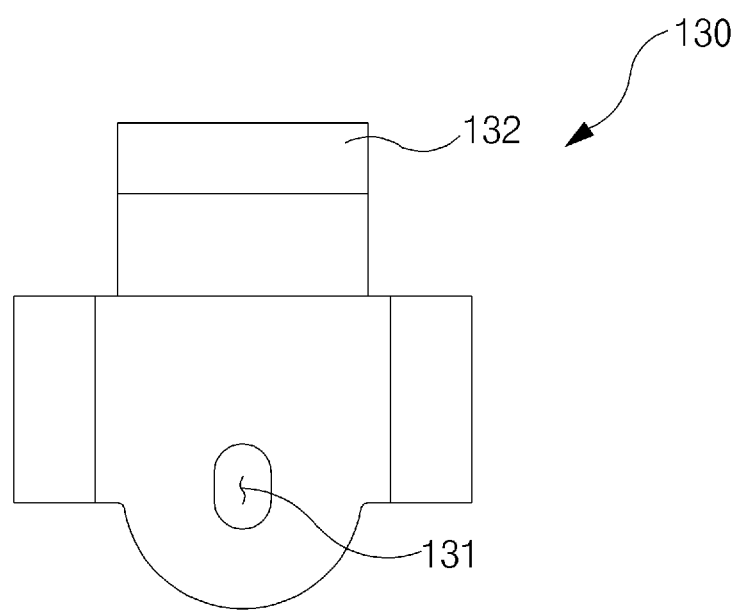
FIG. 5 is a plan view schematically illustrating a contact part of a contact device according to Embodiment 1 of the present invention.

FIG. 5 is a plan view schematically illustrating the contact part 130 of the contact device 10 according to Embodiment 1 of the present invention.

The contact part 130 may be disposed above the connection part 120. Referring to FIG. 5, the contact part 130 may have a lower side at which the coupling hole 131 is defined, and an upper side including a terminal 132 that may be in contact with the cell 2. The lower side at which the coupling hole 131 is defined may have a cross section having a convex outer circumference so as not to be in contact with the connection part 120 during the rotation of the contact part 130.

As described above, the second shaft 122 of the connection part 120 may be coupled to the coupling hole 131. The coupling hole 131 may be a hole defined to cross from one surface to the other surface of the contact part 130.

The second shaft 122 of the connection part 120 is coupled to the coupling hole 131 to allow for the left-right rotation of the contact part 130. Thus, in order for the contact part 130 to easily rotate, the coupling hole 131 may be defined so as to have a cross section having, preferably, a circular shape. However, the shape is not necessarily limited thereto.

When both the coupling hole 131 and the second shaft 122 have a circular cross section, the coupling hole 131 of the contact part 130 may have a circular cross section of which a diameter is greater than the diameter of a cross section of the second shaft 122 so as to allow for easy left-right rotation of the contact part 130.

The terminal 132 is a portion that is in contact with the cell 2 in order to measure the characteristics of the cell 2. Thus, one of the purposes of an embodiment of the present invention is to maximize an area in which the terminal 132 of the contact part 130 and the cell 2 are in contact with each other.

The terminal 132 may have a rectangular parallelepiped shape, and the terminal 132 may have a top surface having a rectangular shape when the contact device 10 is viewed from an upper side. A surface, which is in contact with the cell 2 in order to measure the characteristics of the cell 2, may be the top surface of the terminal 132.

When the contact device 10 is in contact with the cell 2 in order to measure the characteristics of the cell 2, the contact device 10 may be pressed and stressed by the contact with the cell 2 and thus, the cell 2 and the contact device 10 may not be smoothly in contact with each other. Here, when the contact device 10 is movable in a pressing direction, the stress exerted on the contact device 10 may be reduced. In one example to reduce the stress exerted on the contact device 10, the coupling hole 131 defined in the contact part 130 of the contact device 10 according to Embodiment 1 of the present invention may have a shape in which the cross section of the coupling hole is elongated along a longitudinal direction, such that the cross section of the coupling hole is longer than the diameter of the second shaft 122. This allows the second shaft 122 to be movable in the longitudinal direction of the coupling hole 131. Specifically, in the cross section, the length may be greater than the width. Here, the longitudinal direction of the coupling hole 131 may be an upward-downward direction in FIG. 5, wherein the longitudinal direction of the coupling hole is aligned with the longitudinal direction of the contact part. Thus, when the cell 2 is in contact with the terminal 132 of the contact part 130, the contact part 130 may move in the upward-downward direction.

As a brief introduction to an example of the shape in which the coupling hole 131 has the cross section of which the length is longer than the diameter of the second shaft 122, the cross section of the coupling hole 131 may have an oval shape with a major axis provided in the upward-downward direction, and may have a shape in which an upper portion and a lower portion each have a semicircular shape and extend in the upward-downward direction while maintaining a certain width. All of the shapes may be the shape of the coupling hole 131 defined so that the contact part 130 is movable in the upward-downward direction.

When the cross section of the coupling hole 131 has a vertical length longer than the diameter of the second shaft 122, the stress exerted on the contact device 10 may be reduced when the contact device 10 is in contact with the cell 2, so that there may be effects that damage and abrasion of the contact device 10 is minimized and the cell 2 and the contact device 10 are efficiently in contact with each other.

When the contact device 10 measures the characteristics of one cell 2 and the contact part 130 is fixed in a changed state by the rotation and movement, there may be a problem that when measuring the cell 2 having a different contact surface, contact efficiency is deteriorated. Thus, in one example to return the contact part 130 in the changed state to an initial position, the contact part 130 according to Embodiment 1 of the present invention may further include a pair of elastic members 140a and 140b.

Each of the pair of elastic members 140a and 140b may have one end connected to the connection part 120 and the other end connected to the contact part 130. The elastic members 140a and 140b may be provided in a pair to be disposed at left and right sides of the second shaft 122, respectively, when the contact device 10 is viewed from a front side.

When the contact part 130 rotates leftward, the elastic member 140a at the left side of the second shaft 122 may contract and the elastic member 140b at the right side may expand. In contrast, when the contact part 130 rotates rightward, the elastic member 140b at the right side of the second shaft 122 may contract and the elastic member 140a at the left side may expand. When the contact part 130 moves downward, the pair of elastic members 140a and 140b may all contract.

The pair of elastic members 140a and 140b may be generally used springs, but are not necessarily limited thereto.

As the elastic members 140a and 140b return to the initial position, the contact part 130 may move or rotate leftward or rightward with respect to the connection part 120. The contact efficiency of the contact device 10 with the cell 2 may increase and accordingly, there may be an effect that the efficiency of measuring the characteristics of the cell 2 increases. As the contact part 130 may maintain the initial state even though measuring the characteristics of the cell 2, the contact device 10 may be used regardless of whether the battery case of the cell 2 has a chamfered shape or a rectangular shape and thus, the efficiency of the process may increase.

The elastic members 140a and 140b of the contact device 10 according to Embodiment 1 of the present invention may be provided to be parallel to each other. That is, when the first shaft 121 and the second shaft 122 of the connection part 120 are disposed parallel to each other, the elastic members 140a and 140b may be provided to be parallel to a straight line that connects a center of the first shaft 121 and a center of the second shaft 122.

When the pair of elastic members 140a and 140b are parallel to each other, bilateral symmetry may be maintained. Thus, there may be an effect that the contact part 130 that has rotated leftward or rightward with respect to the connection part 120 easily returns to the initial position.

In order to return the elastic members 140a and 140b to the initial position, a temporal change in shape may occur. When the temporal change in shape is repeated several times, the elastic members 140a and 140b may be deformed. In one example to prevent the deformation of the elastic members 140a and 140b and maintain outer appearances of the elastic members 140a and 140b, the connection part 120 of the contact device 10 according to Embodiment 1 of the present invention may further include a connection pillar 123.

When the connection part 120 is viewed from a front side, the connection pillar 123 may be provided in a pair to be disposed at sides of the first shaft 121, respectively, while extending to be parallel to each other in the upward-downward direction. The elastic members 140*a* and 140*b* may be fitted over the connection pillars 123 disposed at the both sides of the first shaft 121, respectively.

When each of the elastic members 140*a* and 140*b* has a circular cross section, the connection pillar 123 may have a cylindrical shape. However, the shape of the connection pillar 123 is not necessarily limited thereto, and the shape of the connection pillar 123 may change according to the shape of the elastic members 140*a* and 140*b*.

When the length of the connection pillar 123 in the upward-downward direction is equal to the length of the elastic members 140*a* and 140*b* in the upward-downward direction, the shape of the elastic members 140*a* and 140*b* may hardly change according to the rotation and movement of the contact part 130. Thus, the length of the connection pillar 123 in the upward-downward direction may be shorter than the length of the elastic members 140*a* and 140*b* in the upward-downward direction so that the shape of the elastic members 140*a* and 140*b* may easily change.

The connection pillar 123 may produce effects that prevent the deformation of the elastic members 140*a* and 140*b* caused by the repeated changes in shape and the outer appearances of the elastic members 140*a* and 140*b* may be maintained despite long time use of the contact device 10. In the contact device 10 according to Embodiment 1 of the present invention, an angle may be displayed on the outer surface of the body part 110, and the connection part 120 may further include an indicator 124.

As described above, when the body part 110 has the cross section of which the upper portion has a semicircular shape when viewed from a front side, the angle displayed on the upper outer circumference may be easily recognized.

Angles between 0 degree and 180 degrees may be displayed, and angles between 0 degree and 90 degrees may be displayed at each of left and right sides so as to easily check the degree at which the connection part 120 rotates leftward or rightward with respect to the body part 110.

The indicator 124 may be provided at one end of the first shaft 121, and may indicate the angle displayed on the outer circumference of the body part 110 when the connection part 120 rotates leftward or rightward with respect to the body part 110.

The indicator 124 may a needle shape having a narrow width so as to easily indicate the angle, and preferably, may have a shape in which a cross section has a width gradually decreasing from top to bottom when viewed from a front side.

There is an effect that when the connection part 120 rotates with respect to the body part 110 in the left-right direction, a rotation angle of the connection part 120 may be checked according to the type of the cell 2. Accordingly, the rotation angle of the connection part 120 according to the type of the cell 2 may be accumulated as data to be utilized in automation of the contact device 10.

The contact device 10 according to Embodiment 1 of the present invention may further include a controller in order to automate the contact device 10 on the basis of the data accumulated in regard to the rotation angle of the connection part 120 according to the type of the cell 2.

The controller may be connected to and operate with the connection part 120 and the contact part 130 and thus, rotate the connection part 120 and the contact part 130 according to preset values previously collected. A servo motor that controls the connection part 120 and the contact part 130 on the basis of a command of the controller may be added.

When an operation of the contact part 130 is automatically controlled according to the type of the cell 2, there may be an effect that the efficiency of the process of measuring the characteristics of the cell 2 increases.

Figure 6:
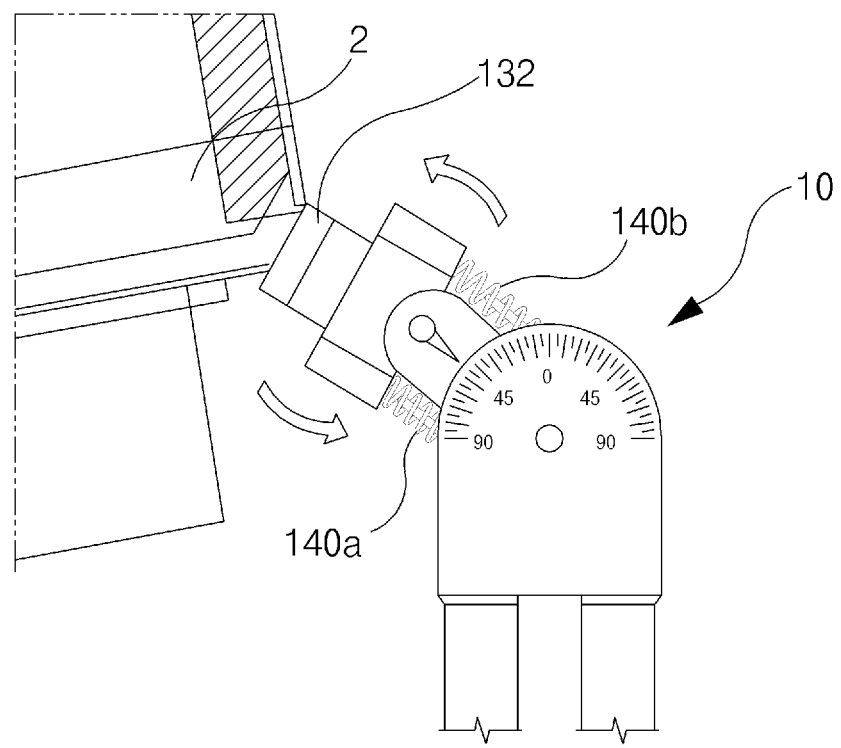
FIG. 6 is a plan view schematically illustrating a state in which a cell is in contact with a contact device according to Embodiment 1 of the present invention.

FIG. 6 is a plan view schematically illustrating a state in which the cell 2 is in contact with the contact device 10 according to Embodiment 1 of the present invention.

In order to increase the accuracy of the process of measuring the characteristics of the cell 2, it is important that the terminal 132 of the contact device 10 is in contact with the entirety of the contact surface of the cell 2 like the configuration illustrated in FIG. 6. In the contact device 10 according to Embodiment 1 of the present invention, as the connection part 120 and the contact part 130 rotate independently of each other and the contact part 130 moves, the likelihood that the terminal 132 of the contact device 10 is in contact with the entirety of the contact surface of the cell 2 may increase to improve the accuracy of the process of measuring the characteristics of the cell 2.

As the contact part 130 is in contact with the cell 2 and then restored to the initial shape due to the elastic members 140*a* and 140*b*, the contact part 130 may be in contact with the cell 2 having various shapes without replacement of the contact device 10. Thus, the efficiency of the process of measuring the characteristics of the cell 2 may be improved.

Embodiment 2

The present invention provides a characteristic measuring device 1 as Embodiment 2.

Figure 7:
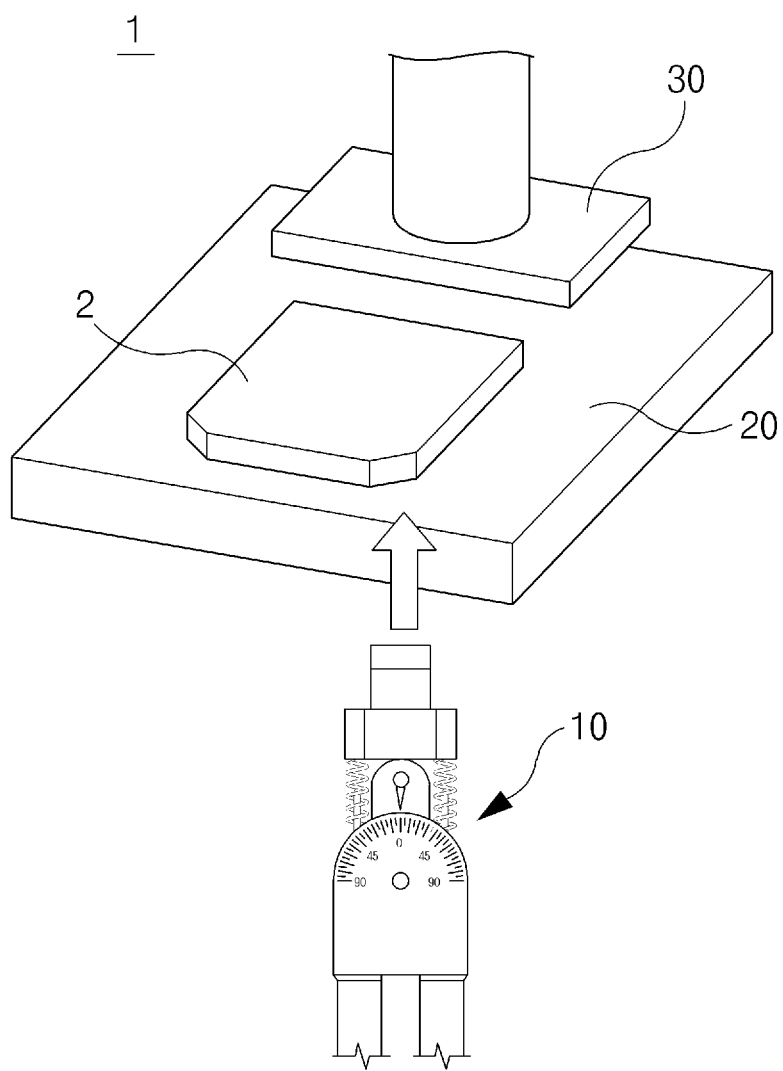
FIG. 7 is a perspective view schematically illustrating a characteristic measuring device according to Embodiment 2 of the present invention.

FIG. 7 is a perspective view schematically illustrating the characteristic measuring device 1 according to Embodiment 2 of the present invention.

The characteristic measuring device 1 may measure the characteristics of a pouch type cell 2, such as insulation resistance. Referring to FIG. 7, the characteristic measuring device 1 according to Embodiment 2 of the present invention may include a contact device 10, a base 20, and a pressing device 30 as components to fix the pouch type cell 2 and measure the characteristics thereof.

A space on which the pouch type cell 2 is disposed is necessary to measure the characteristics of the pouch type cell 2. As one example of such a component, the characteristic measuring device 1 according to Embodiment 2 of the present invention may include the base 20.

The base 20 is a component on which the pouch type cell 2 of which the characteristics are measured is disposed, and a portion on which the pouch type cell 2 is disposed may have a flat top surface for stable arrangement. The base 20 may have a rectangular shape including a flat plate so as to minimize factors such as vibration, which reduces stability during the measurement of the characteristics of the pouch type cell 2. However, the base 20 is not necessarily limited thereto and may have various shapes as necessary.

A component capable of fixing the pouch type cell 2 disposed on the top surface of the base 20 during the measurement of the characteristics is required. As one example of such a component, the characteristic measuring device 1 according to Embodiment 2 of the present invention may include the pressing device 30.

The pressing device 30 may be disposed on an upper portion of the base 20, and may press and fix the pouch type cell 2 disposed on the base 20. The pressing device 30 may have a flat bottom surface so as to fix the pouch type cell 2.

When the pouch type cell 2 is disposed on the base 20, the pressing device 30 may move from above the base 20 toward the pouch type cell 2 while a distance between the bottom surface of the pressing device 30 and the top surface of the base 20 decreases. The pressing device 30 may move to the pouch type cell 2 disposed on the base 20 and then, press the pouch type cell 2 to fix the pouch type cell 2 during the measurement of the characteristics.

When the measurement of the characteristics of the pouch type cell 2 is completed, the pressing device 30 may return to an initial position while the distance between the bottom surface of the pressing device 30 and the top surface of the base 20 increases. When the measurement of the characteristics is completed and the press by the pressing device 30 is released, the pouch type cell 2 may be removed from the top surface of the base 20.

A component such as a cylinder, for movement of the pressing device 30 in the upward-downward direction may be additionally coupled to the pressing device 30.

A component capable of being in contact with the pouch type cell 2 is necessary to measure the characteristics of the pouch type cell 2. As one example of such a component, the characteristic measuring device 1 according to Embodiment 2 of the present invention may include the contact device 10.

Hereinafter, the detailed descriptions of the same components as the components of the contact device 10 according to Embodiment 1 of the present invention will be omitted.

The contact device 10 may include a body part 110 in which a connection hole 111 is defined, a connection part 120 which includes a first shaft 121 and a second shaft 122, and a contact part 130 in which a coupling hole 131 is defined and which includes a terminal 132.

When the contact device 10 is in contact with the pouch type cell 2 for the measurement of the characteristics of the pouch type cell 2, the connection part 120 and the contact part 130 of the contact device 10 may rotate independently of each other in the left-right direction so as to increase the likelihood that the entirety of the contact surface of the pouch type cell 2 may be in contact with the terminal 132 of the contact device 10. Thus, the accuracy of the process may be improved.

In the contact device 10 of the characteristic measuring device 1 according to Embodiment 2 of the present invention, the coupling hole 131 defined in the contact part 130 may have a shape in which the cross section of the coupling hole is elongated along a longitudinal direction, such that the cross section of the coupling hole is longer than the diameter of the second shaft 122. Accordingly, when the pouch type cell 2 is in contact with the contact part 130, the contact part 130 may be movable, and stress exerted on the contact device 10 may be reduced to minimize damage and abrasion of the contact device 10.

The contact device 10 of the characteristic measuring device 1 according to Embodiment 2 of the present invention may further include elastic members 140*a* and 140*b* that provide an elastic force so that the contact part 130, which has rotated leftward or rightward with respect to the connection part 120, returns to the initial position. Accordingly, the characteristics of the pouch type cell 2 having various shapes may be measured without replacement of the characteristic measuring device 1.

In addition, the characteristic measuring device 1 may further include a transfer device such as a conveyor, which is capable of moving the pouch type cell 2 to the top surface of the base 20.

The characteristic measuring device 1 according to Embodiment 2 of the present invention, which measures insulation resistance or the like of the pouch type cell 2, may produce the effects that the contact failure occurring during the measurement of the characteristics may be minimized to improve the accuracy and efficiency of the process of measuring the characteristics the pouch type cell 2.

Although embodiments of the present invention have been described with reference to the limited embodiments and drawings, the present invention is not limited thereto and may be variously implemented by those of ordinary skill in the art to which the present invention pertains, within the technical idea of the present invention and an equivalent of the appended claims.

DESCRIPTION OF THE SYMBOLS

1: Characteristic measuring device
2: Cell
10: Contact device
20: Base
30: Pressing device
110: Body part
111: Connection hole
120: Connection part
121: First shaft
122: Second shaft
123: Connection pillar
124: Indicator
130: Contact part
131: Coupling hole
132: Terminal
140*a*, 140*b*: Elastic member

The invention claimed is:

1. A contact device of a characteristic measuring device configured to measure characteristics of a cell, the contact device comprising:
   a body part including a connection hole passing therethrough;
   a connection part including a first shaft coupled to the connection hole and a second shaft disposed parallel to the first shaft in a longitudinal direction of the connection part; and
   a contact part having a coupling hole passing therethrough and a terminal configured to contact the cell wherein the second shaft is coupled to the coupling hole,
   wherein the connection part is rotatable with respect to the body part by the first shaft,
   wherein the contact part is rotatable with respect to the connection part by the second shaft.

2. The contact device of claim 1, wherein the coupling hole has a cross sectional shape elongated along a longitudinal direction of the contact part, such that the cross sectional shape is longer than a width of the second shaft so that the second shaft is movable in the longitudinal direction of the contact part.

3. The contact device of claim 2, further comprising a pair of elastic members,
   wherein each of the pair of elastic members has one end coupled to the connection part and the other end of each the pair of elastic members coupled to the contact part,
   wherein the pair of elastic members are configured to provide an elastic force so that the contact part returns to an initial position.

4. The contact device of claim 3, wherein each of the pair of elastic members is disposed parallel to each other.

5. The contact device of claim 3, wherein the connection part further comprises a pair of connection pillars extending parallel to each other in the longitudinal direction of the connection part, wherein each of the pair of connection pillars is spaced apart from each other on opposite sides of the first shaft in the longitudinal direction of the connection part, wherein the pair of elastic members are coupled with the pair of connection pillars, respectively.

6. The contact device of claim 1, wherein the body part has an angle range displayed on an outer surface thereof, and the connection part further comprises an indicator disposed on one end of the second shaft, so as to indicate an angle of rotation with respect to the body part.

7. The contact device of claim 1, further comprising a controller connected to the connection part and the contact device,
wherein the controller is configured to rotate the connection part and the contact device depending on a preset value of the cell.

8. A characteristic measuring device configured to measure characteristics of a pouch cell, the characteristic measuring device comprising:
a base configured to receive the pouch cell;
a pressing device disposed above the base and configured to press and fix the pouch cell; and
a contact device configured to be in contact with the pouch cell and measure the characteristics thereof,
wherein the contact device comprises:
a body part including a connection hole passing therethrough,
a connection part including a first shaft coupled to the connection hole and a second shaft disposed parallel to the first shaft in a longitudinal direction of the connection part, and
a contact part having a coupling hole passing therethrough and a terminal configured to contact the pouch cell, wherein the second shaft is coupled to the coupling hole,
wherein the connection part is rotatable with respect to the body part by the first shaft,
wherein the contact part is rotatable with respect to the connection part by the second shaft.

9. The characteristic measuring device of claim 8, wherein the coupling hole has a cross sectional shape elongated along a longitudinal direction of the contact device, such that the cross sectional shape is longer than a width of the second shaft, so that the second shaft is configured to move in the longitudinal direction of the contact device.

10. The characteristic measuring device of claim 9, wherein the contact device further comprises a pair of elastic members,
wherein each of the pair of elastic members has one end coupled to the connection part and the other end of each of the pair of elastic members coupled to the contact part,
wherein the pair of elastic members are configured to provide an elastic force so that the contact part returns to an initial position.

\* \* \* \* \*